United States Patent
Xiong et al.

(10) Patent No.: US 12,038,467 B2
(45) Date of Patent: Jul. 16, 2024

(54) NOISE TOLERANT ELECTRICAL DISCHARGE DETECTION

(71) Applicant: General Electric Company, Schenectady, NY (US)

(72) Inventors: Han Xiong, Niskayuna, NY (US); Karim Younsi, Ballston Lake, NY (US); Lili Zhang, Mason, OH (US); Weijun Yin, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 40 days.

(21) Appl. No.: 17/665,782

(22) Filed: Feb. 7, 2022

(65) Prior Publication Data

US 2023/0251297 A1    Aug. 10, 2023

(51) Int. Cl.
*G01R 31/12* (2020.01)
(52) U.S. Cl.
CPC ................. *G01R 31/1272* (2013.01)
(58) Field of Classification Search
CPC ............. G01R 31/1272; G01R 31/12; G01R 31/1263; G01R 31/1227; G01R 19/16566;
(Continued)

(56) References Cited

U.S. PATENT DOCUMENTS 3,737,769 A    6/1973  Terase et al.
6,313,640 B1 *  11/2001  Nasrallah ........... G01R 31/1272
                                                                 324/536

(Continued)

FOREIGN PATENT DOCUMENTS

CN    102809721 A    12/2012
CN    207675872 U    7/2018
(Continued)

OTHER PUBLICATIONS

Brown, M. (Nov. 9, 2000). Siemens Standard Drives—Application Handbook. Siemens. Retrieved Jun. 11, 2023, from https://media.distributordatasolutions.com/seimens/2017q1/c8065e201235df9bb928c19750f00a75c0cc11d7.pdf. (Year: 2000).*

(Continued)

*Primary Examiner* — Lisa M Caputo
*Assistant Examiner* — Eric Sebastian Von Wald
(74) *Attorney, Agent, or Firm* — Dority & Manning, P.A.

(57) ABSTRACT

Partial discharge detection techniques are provided. In one aspect, a method of detecting partial discharge in an electrical power system having a power electronics converter is provided. A first current signal is captured in response to a first applied voltage. A second current signal is captured in response to a second applied voltage, the second applied voltage being different than the first applied voltage. The first current signal is set as a reference signal. A difference signal is determined based on the second current signal and the reference signal. A determination is made as to whether partial discharge is present based on the difference signal. The method may iterate, and for each iteration, the reference signal is refreshed on a rolling basis as a previously captured current signal measured in response to a previously applied voltage. The applied voltage is also stepped up or down for each iteration.

17 Claims, 10 Drawing Sheets

(58) Field of Classification Search
CPC .. G01R 19/16576; G01R 17/12; G01R 31/08; G01R 31/343; G01R 19/2506; G01R 19/2513; G01R 31/52; H01H 9/50; H02M 1/00
See application file for complete search history.

(56) References Cited

U.S. PATENT DOCUMENTS

| | | | | |
|---|---|---|---|---|
| 6,774,639 | B1* | 8/2004 | Unsworth | H01H 33/26 |
| | | | | 324/536 |
| 7,081,757 | B2 | 7/2006 | Unsworth et al. | |
| 7,209,178 | B1* | 4/2007 | Lee | H04N 21/4143 |
| | | | | 348/518 |
| 8,143,899 | B2 | 3/2012 | Younsi et al. | |
| 8,242,786 | B2* | 8/2012 | Fuhrmann | G01R 31/1245 |
| | | | | 324/536 |
| 8,576,520 | B2 | 11/2013 | Pamer et al. | |
| 9,322,881 | B2* | 4/2016 | Sakurai | G01R 31/14 |
| 9,945,897 | B2* | 4/2018 | Neti | G01R 31/52 |
| 9,976,989 | B2 | 5/2018 | Dehghan Niri et al. | |
| 10,444,273 | B2 | 10/2019 | Ikegami et al. | |
| 10,677,835 | B2 | 6/2020 | Sekiguchi et al. | |
| 10,962,584 | B2 | 3/2021 | Candela et al. | |
| 11,150,291 | B1* | 10/2021 | Smith | H01B 7/18 |
| 2011/0019444 | A1 | 1/2011 | Dargatz et al. | |
| 2014/0320149 | A1* | 10/2014 | Ecker | G01R 31/58 |
| | | | | 324/551 |
| 2020/0225274 | A1* | 7/2020 | Manson | G01R 31/14 |
| 2021/0123966 | A1 | 4/2021 | Karin et al. | |

FOREIGN PATENT DOCUMENTS

| | | | | |
|---|---|---|---|---|
| CN | 110456236 A | 11/2019 | | |
| EP | 639879 A2 * | 2/1995 | ........... | G01R 31/025 |
| EP | 1418437 A1 | 5/2004 | | |
| JP | H0545399 A * | 2/1995 | | |
| JP | 6602519 B1 * | 11/2019 | | |

OTHER PUBLICATIONS

Cavallini et al., The Influence of PWM Voltage Waveforms on Induction Motor Insulation Systems: Perspectives for the End User, IEEE 8$^{th}$ IEEE Symposium on Diagnostics for Electrical Machines, Power Electronics & Drives, 2011, pp. 288-293. (Abstract Only) https://ieeexplore.ieee.org/document/6063638.

IEEE Electrical Insulation Magazine (IEEE Electr Insul M), 0883-7554, Institute of Electrical and Electronics Engineers. Internet web resource/Web Link:https://www.researchgate.net/journal/IEEE-Electrical-Insulation-Magazine-0883-7554.

Sedding et al., Measuring Partial Discharge on Operating Motors with VS-PWM Drives, 2017 INSUCON—13th International Electrical Insulation Conference (INSUCON), 2017, 6 Pages. https://irispower.com/wp-content/uploads/2020/01/Measuring-Partial-Discharge-on-Operating-Motors-with-VS-PWM-Drivers.pdf.

* cited by examiner

NOISE TOLERANT ELECTRICAL DISCHARGE DETECTION

FIELD

The present disclosure relates to detection of electrical discharge.

BACKGROUND

Electrical power systems, such as those found in aircraft electric and hybrid-electric propulsion systems, can employ various power electronic converters for the control and/or conversion of electrical power. Power electronics-based electrical power systems can offer dynamic speed control and greater energy efficiency, among other benefits. However, there are certain challenges associated with such electrical power systems, such as reliably detecting partial discharge. The presence of partial discharge may lead to degradation of insulating materials and other packaging materials that do not have partial discharge resistance.

Accordingly, an improved technique for detecting partial discharge would be a useful addition to the art.

BRIEF DESCRIPTION OF THE DRAWINGS

A full and enabling disclosure of the present disclosure, including the best mode thereof, directed to one of ordinary skill in the art, is set forth in the specification, which makes reference to the appended figures, in which.

DETAILED DESCRIPTION

Figure 1:
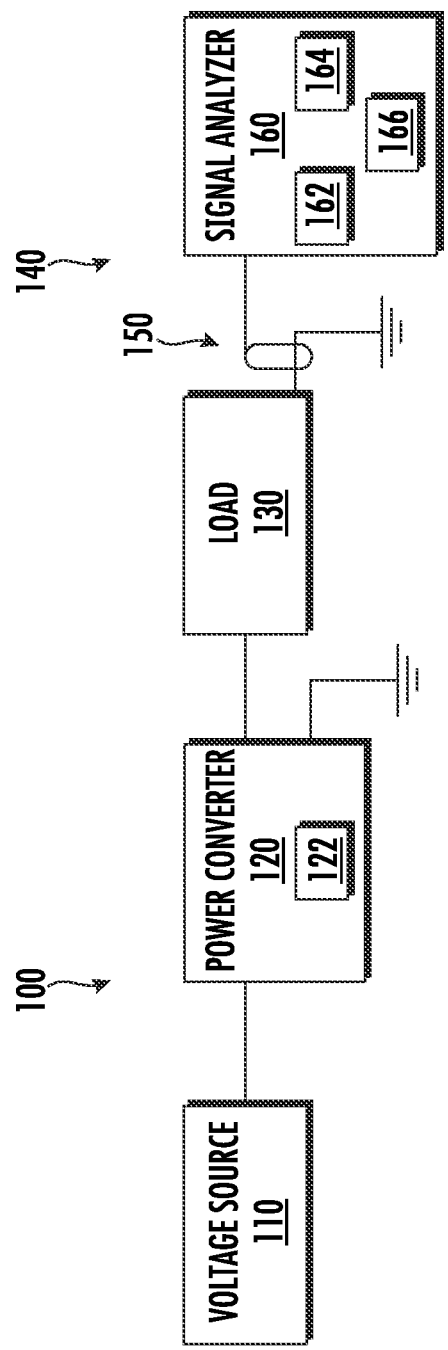
FIG. 1 provides a diagram of a detection system coupled with an electrical power system in accordance with an example aspect of the present disclosure.

Reference will now be made in detail to present embodiments of the disclosure, one or more examples of which are illustrated in the accompanying drawings. The detailed description uses numerical and letter designations to refer to features in the drawings. Like or similar designations in the drawings and description have been used to refer to like or similar parts of the disclosure.

As used herein, the terms "first", "second", and "third" may be used interchangeably to distinguish one component from another and are not intended to signify location or importance of the individual components.

The terms "coupled," "fixed," "attached to," and the like refer to both direct coupling, fixing, or attaching, as well as indirect coupling, fixing, or attaching through one or more intermediate components or features, unless otherwise specified herein.

The singular forms "a", "an", and "the" include plural references unless the context clearly dictates otherwise.

The term "at least one of" in the context of, e.g., "at least one of A, B, and C" refers only A, only B, only C, or any combination of A, B, and C.

Approximating language, as used herein throughout the specification and claims, is applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value, or the precision of the methods or machines for constructing or manufacturing the components and/or systems. For example, the approximating language may refer to being within a 1, 2, 4, 10, 15, or 20 percent margin. These approximating margins may apply to a single value, either or both endpoints defining numerical ranges, and/or the margin for ranges between endpoints.

Here and throughout the specification and claims, range limitations are combined and interchanged, such ranges are identified and include all the sub-ranges contained therein unless context or language indicates otherwise. For example, all ranges disclosed herein are inclusive of the endpoints, and the endpoints are independently combinable with each other.

Power electronic converters can offer dynamic control of electrical power and greater energy efficiency for electrical power systems. However, as noted, such power electronics-based electrical power systems can experience partial discharge, or localized electrical discharge that only partially bridges insulation between conductors. The presence of partial discharge may lead to degradation of insulation systems and other packaging materials. Detecting partial discharge can be advantageous, e.g., for detecting and/or predicting insulation system failure, developing maintenance schedules, monitoring component health, etc. However, reliably detecting partial discharge has conventionally been difficult, particularly at high switching frequencies. At high switching frequencies, partial discharge signals can become hidden in noise, such as transient current responses or current clusters that occur due to voltage changes. Voltage changes occur due to switching of switching devices of the power converter.

In accordance with the inventive aspects of the present disclosure, a detection technique is provided that may reliably detect partial discharge, even at high switching frequencies. Generally, the disclosed detection technique is implemented by iterating a detection sequence that uses a reference signal refreshed on a rolling basis. The reference signal can be refreshed on a rolling basis continuously or at each iteration of the detection sequence, for example. The reference signal is refreshed on a rolling basis as a previously captured current signal measured in response to a previously applied voltage. The applied voltage is stepped up or changed at each iteration of the detection sequence. For a given iteration, the reference signal and a presently captured current signal measured in response to a presently applied voltage are utilized to determine a difference signal. The difference signal can be determined by subtracting the reference signal from the presently applied current signal, for example. The difference signal can be used to determine whether partial discharge is present at the presently applied voltage. For instance, if the magnitude of the difference signal exceeds a threshold, partial discharge is determined as being present at the presently applied voltage. In this regard, the partial discharge inception voltage can be determined. When partial discharge is in fact present, the magnitude of the difference signal is typically much greater than its expected magnitude. Partial discharge occurs suddenly and at magnitudes that exceed expected magnitudes.

Once partial discharge is determined as being present at the presently applied voltage, i.e., once the partial discharge inception voltage is reached, in some implementations, the detection sequence can be iterated one or more times to confirm the presence of partial discharge. In this regard, the applied voltage can be stepped up even further. For instance, the detection sequence can be iterated until the applied voltage is greater than or equal to the partial discharge inception voltage by a predetermined percentage, e.g., by 10%, etc.

Further, in some implementations, the detection sequence can be implemented to find the partial discharge extinction voltage, or the voltage at which partial discharge pulses cease to occur when the applied voltage is decreased from an applied voltage higher than the partial discharge inception voltage. For instance, for each iteration of the detection sequence, the voltage can be stepped down and, if the magnitude of the difference signal does not exceed a threshold, then the presently applied voltage associated with that iteration is determined as the partial discharge extinction voltage.

The disclosed detection technique can provide a number of advantages, benefits, and/or technical effects. For instance, generally, the disclosed detection technique allows for detection of electrical discharge activity without loss of signal across the full frequency bandwidth of kilohertz (kHz) and gigahertz (GHz). Also, notably, partial discharge signals hidden in noise, such as transient current responses or current clusters, can be more easily detected because the disclosed detection technique is a time domain-based detection technique rather than a frequency domain-based detection technique. Moreover, in addition to determining whether partial discharge is present, various properties about a detected partial discharge signal can be determined, such as pulse shape, pulse magnitude, and/or a frequency associated with the partial discharge signal. The disclosed technique also not only allows for detection of the partial discharge inception voltage, but also the partial discharge extinction voltage. The detection technique can be implemented in "reverse" to detect the partial discharge extinction voltage. The detection technique may have other advantages and benefits not expressly noted herein.

Further, the disclosed detection technique can be implemented for various applications. For instance, the disclosed detection technique can be implemented during development of components or in the field. For instance, the present detection technique can allow for a fine characterization of test samples and prototypes during the development stage and during long-term testing using highly accelerated life tests to help estimate and determine future field reliability. In the field, the present detection technique can be applied to monitor electrical discharge activity of pulse-driven systems, may help estimate the health status of electrical components, and may prevent failures and unplanned outages.

The present detection technique is applicable to any industry in which power electronics-based electrical power systems are provided. Example industries include, but are not limited to, the aviation industry (e.g., for electric and hybrid-electric aircraft), the power generation industry, the automotive industry, the marine vehicle industry, among others. In some example embodiments, the disclosed detection technique can be implemented for various aviation applications, such as for testing of equipment for quality prior to shipment; post-delivery inspection on wing or in a service shop; and/or in flight with active monitoring of electrical power systems and/or components thereof.

FIG. 1 provides a diagram of a system 100 in accordance with an example aspect of the present disclosure. For this embodiment, the system 100 is an electrical power system. The system 100 includes a voltage source 110. The voltage source 110 can be one or more batteries, for example. The voltage source 110 is electrically coupled with power electronics, which in this embodiment includes a power converter 120 having a plurality of switching devices 122. The switching devices 122 can be switched in a controlled manner to control the electrical power drawn from and/or provided to the voltage source 110. As one example, the one or more switching devices 122 can be Silicon Carbide (SiC) Metal Oxide Semiconductor Field Effect Transistors (MOSFETs). The power converter 120 is, in turn, electrically coupled with a load 130. The load 130 can be an electric machine, for example.

A detection system 140 is electrically coupled with the load 130, e.g., via a power bus. Generally, the detection system 140 is configured to detect partial discharge associated with the system 100. The detection system 140 includes a sensing device, which, in this embodiment, is a current transducer 150 electrically coupled with the load 130. The current transducer 150 is operable to measure or sense electrical current. In alternative embodiments, the current transducer 150 can be positioned in other suitable locations, such as between the power converter 120 and the load 130. Other positions are possible.

The detection system 140 also includes a signal analyzer 160. The signal analyzer 160 can include one or more processors 162, one or more memory devices 164, and one or more displays 166. The signal analyzer 160 can be or include an oscilloscope, for example. Generally, the signal analyzer 160 is configured to receive, process, and generate signals, as well as render images of such signals, such as images of electrical current signals captured by the current transducer 150 in response to voltage changes caused by modulation of the switching devices 122 of the power converter 120. A more detailed disclosure of the signal analyzer 160 may be found in FIG. 9 and the accompanying text.

Figure 2:
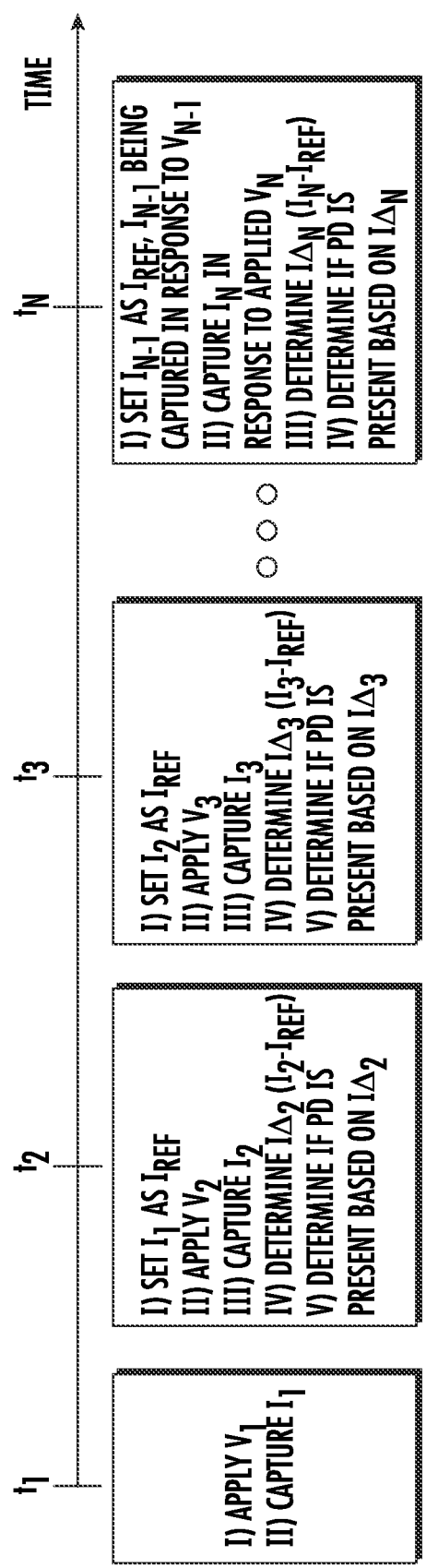
FIG. 2 provides a sequence diagram depicting an example manner in which the detection system of FIG. 1 may detect partial discharge associated with the electrical power system of FIG. 1.

With reference now to FIGS. 1 and 2, FIG. 2 provides a sequence diagram depicting an example manner in which the detection system 140 may detect partial discharge associated with the system 100. Particularly, FIG. 2 provides an example detection sequence that can be implemented to detect partial discharge associated with the system 100.

As shown, at a first time t1, a first voltage V1 is applied. For instance, the switching devices 122 of the power converter 120 can be controlled to apply a first voltage V1.

Modulation of the switching devices 122 can cause electrical power to be transmitted from the voltage source 110 to the load 130 or vice versa. When the first voltage V1 is applied, the current transducer 150 can capture a first current signal I1 in response to the first applied voltage V1. The captured first current signal I1 can be received by the one or more processors 162. The received first current signal I1 can be saved or stored on the one or more memory devices 164. Moreover, the first current signal I1 can be presented on the display 166.

Figure 3:
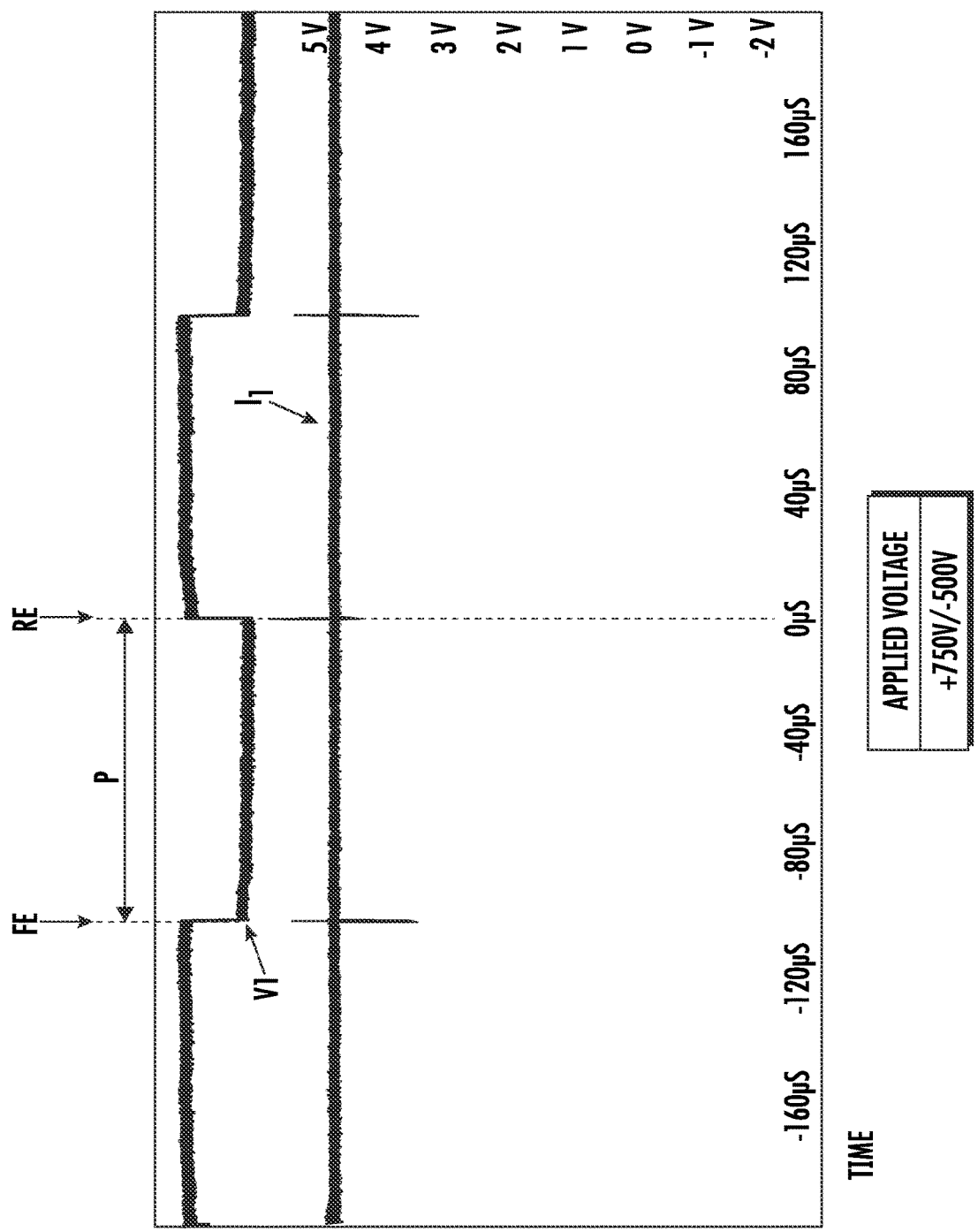
FIG. 3 provides a graph displaying various signals, including a first applied voltage and a first current signal captured in response to the first applied voltage.

By way of example, FIG. 3 provides a graph displaying various signals, including the first applied voltage V1 and the first current signal I1 captured in response to the first applied voltage V1. The signals are presented as a function of time on the graph of FIG. 3. As shown in the example of FIG. 3, the first applied voltage V1 is pulsed, e.g., in square waves. For this example embodiment, the first applied voltage V1 is pulsed at +750V/−500V, rendering a 1250V peak-to-peak applied voltage. Each pulse P has an associated falling edge FE and rising edge RE (only one pulse is labeled in FIG. 3). Each falling edge FE and each rising edge RE corresponds to a change in position or modulation of the switching devices 122 of the power converter 120. The falling and rising edges FE, RE may also be denoted as switching edges.

As illustrated in FIG. 3, the captured first current signal I1 has a transient response at each falling edge FE and at each rising edge RE. That is, each time the switching devices 122 are switched, the first current signal I1 experiences a transient response. As will be appreciated, a change in voltage causes a change in electrical current. This is made apparent by the relatively large magnitude spikes of the first current signal I1 at the times corresponding to the switching edges of the pulses of the first voltage V1. As noted above, the first current signal I1 can be captured by the current transducer 150, received by the one or more processors 162, saved to the one or more memory devices 164, and presented on the display 166 as depicted in FIG. 3.

Returning to FIGS. 1 and 2, at time t2, the detection sequence continues. Specifically, at time t2, the one or more processors 162 can set the first current signal I1 as a reference signal $I_{REF}$. The first current signal I1 can alternatively be set as the reference signal $I_{REF}$ at time t1. Further, at time t2, a second voltage V2 is applied. The switching devices 122 of the power converter 120 can be controlled to apply the second voltage V2. The second voltage V2 is different than the first voltage V1. Particularly, the second voltage V2 can be greater than the first voltage V1. The second voltage V2 can be increased by a predetermined voltage increase or step, such as by 50V. In some embodiments, for example, the predetermined voltage increase or step can be between 50 and 300V.

When the second voltage V2 is applied, the current transducer 150 can capture a second current signal I2 in response to the second applied voltage V2. The captured second current signal I2 can be received by the one or more processors 162. The received second current signal I2 can be saved or stored on the one or more memory devices 164. Moreover, the second current signal I2 can be presented on the display 166.

The one or more processors 162 of the detection system 140 can determine a difference signal IΔ2 based at least in part on the second current signal I2 and the reference signal $I_{REF}$. For instance, in some embodiments, the difference signal IΔ2 can be determined by subtracting the reference signal $I_{REF}$ from the second current signal I2, or stated mathematically, IΔ2=I2−$I_{REF}$. Thus, in such embodiments, the reference signal $I_{REF}$ can be defined as a difference between the present current signal, or the second current signal I2 in this instance, and the reference signal $I_{REF}$.

In other example embodiments, the difference signal IΔ2 can be determined by multiplying the reference signal $I_{REF}$ by a correction coefficient represented as a quotient defined by the presently applied voltage (the second voltage V2 in this instance) divided by the previously applied voltage (the first voltage V1 in this instance), and then subtracting the product of the reference signal $I_{REF}$ and the correction coefficient from the second current signal I2, or stated mathematically in this instance, IΔ2=I2−($I_{REF}$*(V2/V1)). Multiplying the reference signal $I_{REF}$ by the correction coefficient as noted above may further increase partial detection sensitivity and may further reduce error when using linear extrapolation. For example, in embodiments in which the first applied voltage V1 and the second applied voltage V2 are relatively close to one another, a linear response can be assumed in a local range. Based on the current response at the first applied voltage V1, which is the reference signal $I_{REF}$ in this instance, the current response linear extrapolation at the second applied voltage V2 should be or approximately be I2'=$I_{REF}$*(V2/V1), so the differential would be IΔ2=I2−I2', which is IΔ2=I2−($I_{REF}$*(V2/V1)). If partial discharge is not present, the difference signal IΔ2 should be infinitely small. If partial discharge is present, the difference signal IΔ2 will be present beyond the noise level in the time domain.

The resultant difference signal IΔ2 can be presented on the display 166. The one or more processors 162 can then determine whether partial discharge is present based at least in part on the difference signal IΔ2. For instance, when a magnitude of the difference signal IΔ2 exceeds a threshold, then partial discharge is determined as being present. In contrast, when the magnitude of the difference signal IΔ2 does not exceed the threshold, then partial discharge is determined as not being present.

Figure 4:
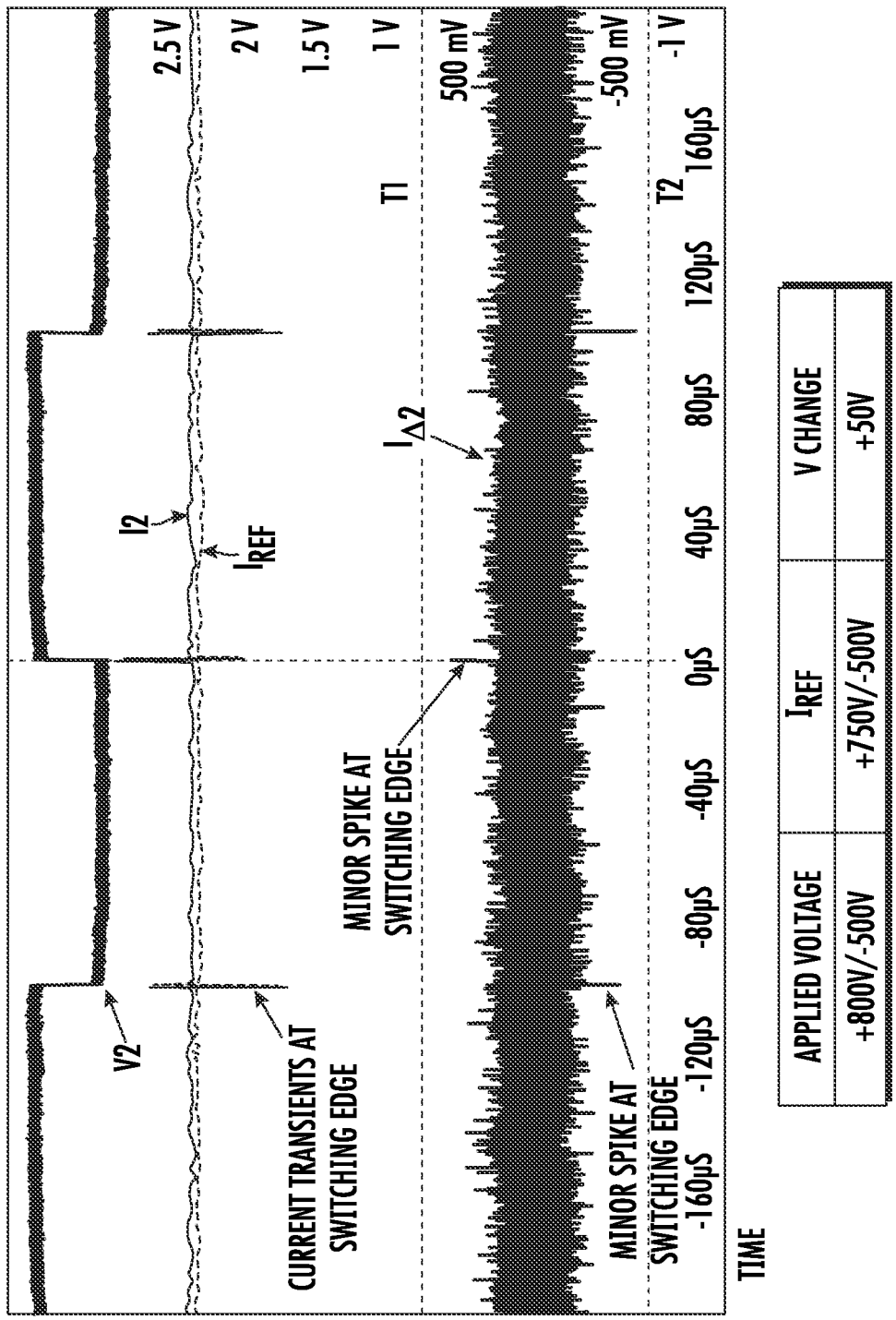
FIG. 4 provides a graph displaying various signals, including a second applied voltage, a second current signal captured in response to the second applied voltage, a reference signal, and a difference signal.

Continuing with the example above, FIG. 4 provides a graph displaying various signals, including the second applied voltage V2, the second current signal I2 captured in response to the second applied voltage V2, the reference signal $I_{REF}$, and the difference signal IΔ2. As noted above, the second current signal I2 can be captured by the current transducer 150, received by the one or more processors 162, saved to the one or more memory devices 164, and presented on the display 166, e.g., as depicted in FIG. 4. In this instance, the reference signal $I_{REF}$ is set as the first current signal I1 captured in response to the first applied voltage V1. The reference signal $I_{REF}$ is shown slightly offset from the second current signal I2 in FIG. 4 due to the voltage difference between the first voltage V1 and the second voltage V2 as explained below.

As shown in the example of FIG. 4, the second applied voltage V2 is pulsed, e.g., in square waves. For this example, the second applied voltage V2 is pulsed at +800V/−500V, rendering a 1300V peak-to-peak applied voltage. Accordingly, between the 1250V peak-to-peak applied first voltage V1 (FIG. 3) and the 1300V peak-to-peak applied second voltage V2, the voltage has increased by 50V. That is, the second voltage V2 is 50V greater than the first voltage V1. Consequently, the second current signal I2 has a slightly different response than the first current signal I1. The first current signal I1 is set as the reference signal $I_{REF}$ in this iteration of the sequence. The difference in the first and second current responses I1, I2 causes the resultant difference signal IΔ2 to have relatively large magnitudes at times corresponding to the current transients caused by modulation of the switching devices 122. As shown in FIG. 4, there are relatively large "bumps" or amplitude spikes at times corresponding to modulation of the switching devices 122. Such spikes or bumps are expected.

With the difference signal I∆2 determined by the one or more processors 162, the one or more processors 162 can determine whether partial discharge is present. For instance, when a magnitude of the difference signal I∆2 exceeds a threshold, such as a first threshold T1 or a second threshold T2 depicted in FIG. 4, then partial discharge is determined as being present. In this example, none of the positive polarity amplitude spikes of the difference signal I∆2 that occur at times corresponding to the rising edges of the pulses exceed the first threshold T1 and none of the negative polarity amplitude spikes of the difference signal I∆2 that occur at times corresponding to the falling edges of the pulses exceed the second threshold T2. In this regard, partial discharge has not been detected during this iteration of the detection sequence.

Returning again to FIGS. 1 and 2, at time t3, the detection sequence is iterated once again. Notably, for each iteration of the detection sequence, the reference signal $I_{REF}$ can be set or updated on a rolling basis with the previously captured current signal. Accordingly, at time t3, the one or more processors 162 set the second current signal I2 as the reference signal $I_{REF}$. Further, at time t3, a third voltage V3 is applied. The switching devices 122 of the power converter 120 can be controlled to apply the third voltage V3. The third voltage V3 is different than the second voltage V2. Particularly, the third voltage V3 can be greater than the second voltage V2. The third voltage V3 can be increased by the predetermined voltage increase, such as by 50V. In some embodiments, the predetermined voltage increase can be set as a constant step or value. That is, the predetermined voltage increase can be fixed from iteration to iteration (e.g., so that the voltage is increased by 25V for each iteration of the detection sequence). In other embodiments, the predetermined voltage increase can be variable. For instance, the predetermined voltage increase can be stepped down or reduced as the applied voltage approaches a predicted partial discharge inception voltage associated with a particular load or sample. For instance, the predetermined voltage increase can be reduced from 50V increases to 25V increases as the applied voltage approaches the predicted partial discharge inception voltage.

When the third voltage V3 is applied, the current transducer 150 can capture a third current signal I3 in response to the third applied voltage V3. The captured third current signal I3 can be received by the one or more processors 162. The received third current signal I3 can be saved or stored on the one or more memory devices 164. Moreover, the third current signal I3 can be presented on the display 166.

The one or more processors 162 of the detection system 140 can determine a difference signal I∆3 based at least in part on the third current signal I3 and the reference signal $I_{REF}$. For instance, the reference signal $I_{REF}$ can be subtracted from the third current signal I3 to determine the difference signal I∆3. The determined difference signal I∆3 can be presented on the display 166. The one or more processors 162 can then determine whether partial discharge is present based at least in part on the difference signal I∆3. For instance, when a magnitude of the difference signal I∆3 exceeds a threshold, then partial discharge is determined as being present. In contrast, when the magnitude of the difference signal I∆3 does not exceed the threshold, then partial discharge is determined as not being present.

Figure 5:
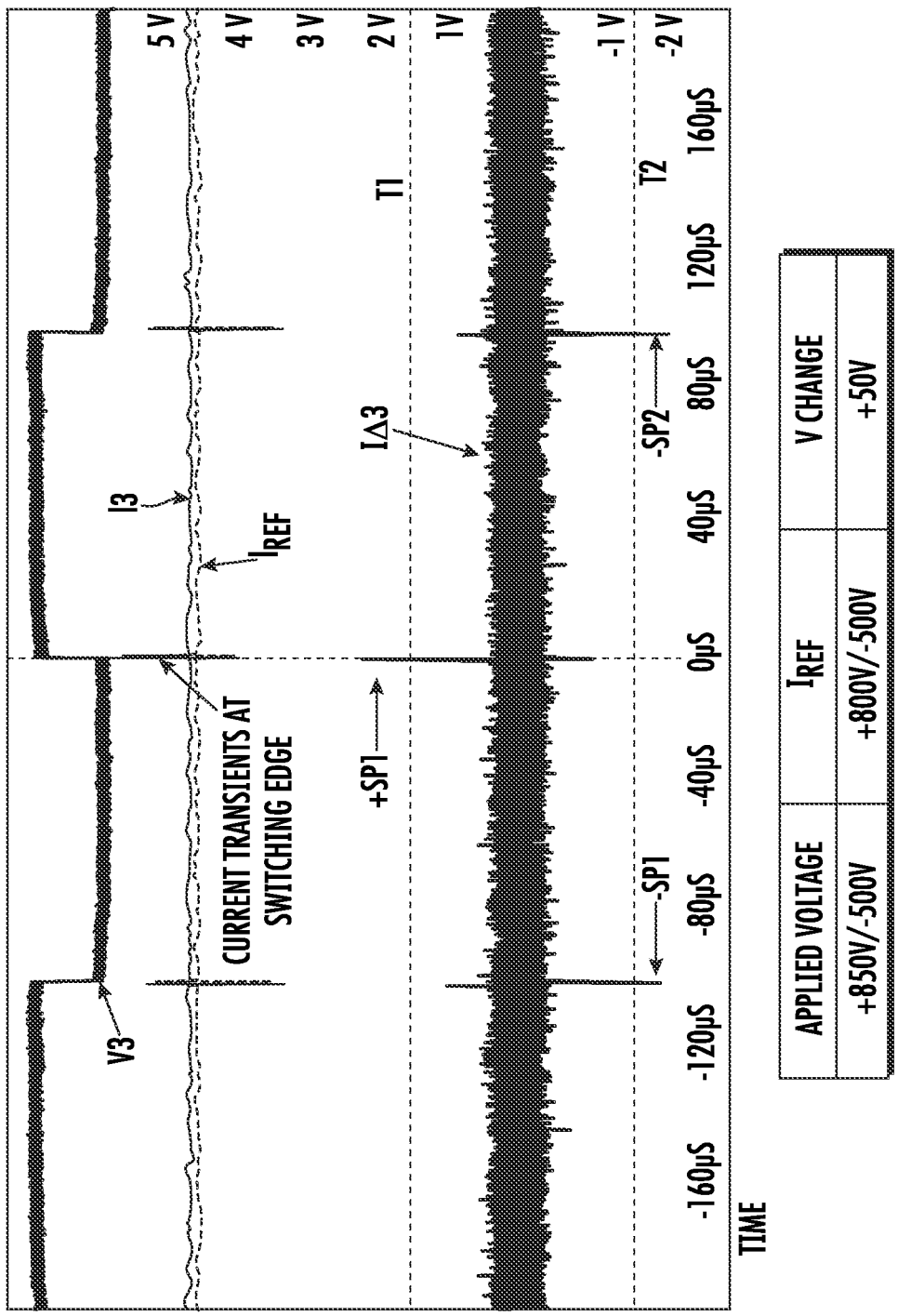
FIG. 5 provides a graph displaying various signals, including a third applied voltage, a third current signal captured in response to the third applied voltage, an updated reference signal, and a difference signal determined based on the updated reference signal and the third current signal.

Continuing with the example above, FIG. 5 provides a graph displaying various signals, including the third applied voltage V3, the third current signal I3 captured in response to the third applied voltage V3, the reference signal $I_{REF}$ updated as the second current signal I2, and the difference signal I∆3. The third current signal I3 can be captured by the current transducer 150, received by the one or more processors 162, saved to the one or more memory devices 164, and presented on the display 166, e.g., as depicted in FIG. 5. In this instance, the reference signal $I_{REF}$ is set as the second current signal I2 captured in response to the second applied voltage V2. The reference signal $I_{REF}$ is shown slightly offset from the third current signal I3 in FIG. 5 due to the voltage difference between the second voltage V2 and the third voltage V3 as explained more fully below.

As illustrated in FIG. 5, the third applied voltage V3 is pulsed, e.g., in square waves. For this example, the third applied voltage V3 is pulsed at +850V/−500V, rendering a 1350V peak-to-peak applied voltage. Accordingly, between the 1300V peak-to-peak applied second voltage V2 (FIG. 4) and the 1350V peak-to-peak applied third voltage V3, the voltage has increased by 50V. Stated another way, the third voltage V3 is 50V greater than the second voltage V2. Thus, the third current signal I3 has a slightly different response than the second current signal I2, which is set as the reference signal $I_{REF}$ in this iteration of the sequence. The difference in the second and third current responses I2, I3 causes the resultant difference signal I∆3 to have relatively large magnitudes at times corresponding to the current transients caused by modulation of the switching devices 122. Relatively large "bumps" or spikes at times corresponding to modulation of the switching devices 122 are expected, but amplitude spikes beyond expectations may indicate the presence of partial discharge.

Particularly, with the difference signal I∆3 determined by the one or more processors 162, the one or more processors 162 can determine whether partial discharge is present. For instance, when a magnitude of the difference signal I∆3 exceeds a threshold, such as the first threshold T1 or the second threshold T2 depicted in FIG. 5, then partial discharge is determined as being present. In this example, a first positive polarity amplitude spike+SP1 of the difference signal I∆3 occurring at a time corresponding to a rising edge of one of the pulses exceeds the first threshold T1. In this regard, the amplitude of the first positive polarity amplitude spike+SP1 is greater or larger than the expected amplitude at this time. The amplitude of the of the difference signal I∆3 exceeding the threshold indicates that partial discharge is present. Further, a first negative polarity amplitude spike −SP1 and a second negative polarity amplitude spike −SP2 of the difference signal I∆3 occurring at times corresponding to falling edges of respective pulses exceed the second threshold T2. In this regard, the amplitude of the first negative polarity amplitude spike −SP1 and the second negative polarity spike −SP2 are both larger than the expected amplitude at these times, which indicates partial discharge in the system 100. As shown in the example of FIG. 5, partial discharge occurs suddenly and at magnitudes that exceed expected magnitudes.

The expected amplitude at the switching edges of the pulses can be predicted accurately, at least for the reason that current transients or magnitude bumps in electrical current increase linearly or substantially linearly with the increase in voltage. Accordingly, the thresholds can be set in accordance with the expected amplitude of the difference signal at the switching edges given the voltage increase from the previous iteration of the detection sequence. Use of the expected amplitude allows for the thresholds to be accurately set no matter the predetermined voltage increase between iterations of the detection sequence. Accurately setting the thresholds leads to accurate detection of partial discharge.

Figure 6:
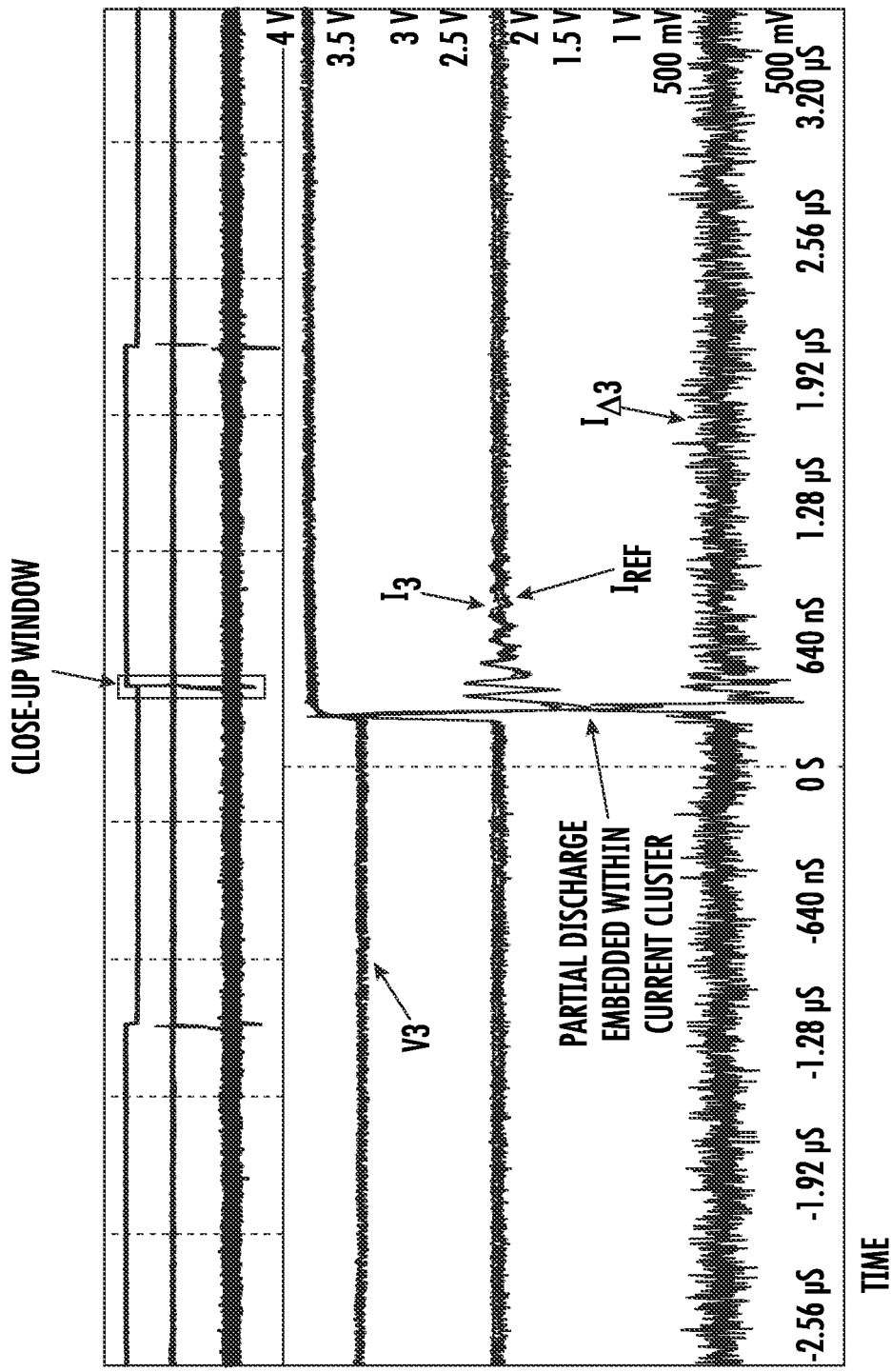
FIG. 6 provides a zoomed-in view of the graph of FIG. 5.

FIG. 6 depicts a zoomed-in view of the graph of FIG. 5. In FIG. 6, the transient response of the third current signal I3 in response to the peak-to-peak change of the third applied voltage V3 is shown more clearly. The transient response of the second current signal, which is the reference signal $I_{REF}$ in FIG. 6, is also shown more clearly. As further shown in FIG. 6, the magnitude spike of the difference signal IΔ3 associated with partial discharge is embedded within the current cluster or transient current responses. The generation of the difference signal IΔ3, which is a time domain-based signal, allows for detection of partial discharge even when partial discharge occurs embedded within the noise of current transients. The magnitude of the difference signal IΔ3 can be analyzed for partial discharge (e.g., compared to a threshold) regardless of whether the spike associated with switching, which may or may not represent partial discharge, is embedded within a current transient or cluster. This advantage is particularly useful for higher switching frequency applications.

Moreover, in addition to determining whether partial discharge is present, various properties about the partial discharge signal can be determined. For instance, a pulse shape, a pulse magnitude, and/or a frequency associated with the partial discharge signal can be determined, among other possibilities. In this regard, the partial discharge detection technique provided herein is not only a pass/fail test, but may also allow for certain properties of a detected partial discharge signal to be determined.

As further shown in FIG. 2, in the event partial discharge is not detected at time t3 or at another future time, further iterations of the detection sequence can continue in the same manner as noted above. Any suitable number of iterations of the detection sequence can be implemented. For instance, N number of iterations can be implemented until the partial discharge inception voltage is determined, wherein N is an integer. The detection sequence is generically expressed at time $t_N$. Each time the detection sequence is implemented, implementing the detection sequence can include i) setting a previously captured current signal $I_{N-1}$ captured at a previous time (e.g., at $t_{N-1}$; not shown) in response to a previously applied voltage $V_{N-1}$ as a reference signal $I_{REF}$; ii) capturing a present current signal $I_N$ captured in response to a presently applied voltage $V_N$, wherein the presently applied voltage $V_N$ is different than (e.g., greater than) the previously applied voltage $V_{N-1}$; iii) determining a difference signal $\Delta_N$ based at least in part on the present current signal $I_N$ and the reference signal $I_{REF}$; and iv) determining whether partial discharge is present based at least in part on the difference signal $\Delta_N$. As will be appreciated in view of the present disclosure, during the next iteration of the sequence at time $t_{N+1}$ (not shown), the captured current signal $I_N$ captured in response to the applied voltage $V_N$ becomes the previously captured current signal and is thus set as the reference signal $I_{REF}$. In this way, the reference signal is updated on a rolling basis.

Figure 7:
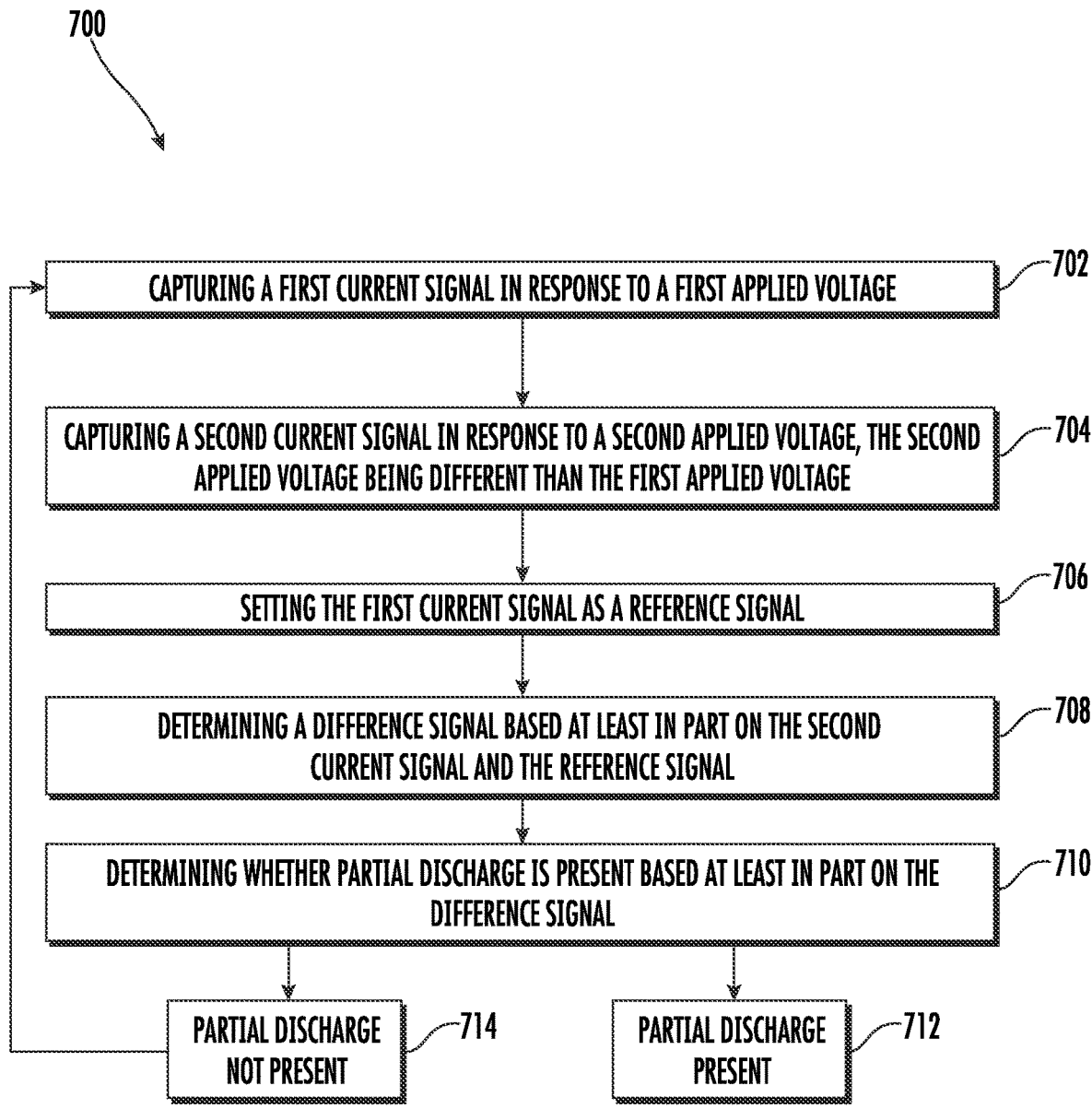
FIG. 7 provides a flow diagram for a method of detecting partial discharge in accordance with an example aspect of the present disclosure.

FIG. 7 provides a flow diagram for a method 700 of detecting partial discharge in an electrical power system having a power electronics converter.

At 702, the method 700 includes capturing a first current signal in response to a first applied voltage. For instance, a plurality of switching devices of a power electronics converter can be caused to switch, thereby causing a first applied voltage to be pulsed (i.e., as a pulse width modulated signal). Applying the first voltage can cause electrical power to be transmitted between a voltage source and a load, both of which are electrically coupled with the power electronics converter. A current transducer or other current sensor can capture the first current signal in response to the first applied voltage. The captured first current signal can be provided to one or more processors of a signal analyzer. The one or more processors can receive the captured first current signal. One or more memory devices of the signal analyzer can store the first current signal.

At 704, the method 700 includes capturing a second current signal in response to a second applied voltage, the second applied voltage being different than the first applied voltage. For instance, the plurality of switching devices of the power electronics converter can be caused to switch so as to apply a second applied voltage. The switching devices can be controlled to pulse (i.e., as a pulse width modulated signal) the second applied voltage. The second applied voltage can be stepped up by a predetermined voltage increase or step. In some implementations, for example, the predetermined voltage increase or step can be between 50 and 300V. The current transducer can capture the second current signal in response to the second applied voltage. The captured second current signal can be provided to the one or more processors of the signal analyzer. The one or more processors can receive the captured second current signal. One or more memory devices of the signal analyzer can store the second current signal.

At 706, the method 700 includes setting the first current signal as a reference signal. For instance, the one or more processors of the signal analyzer can set the stored first current signal as the reference signal.

At 708, the method 700 includes determining a difference signal based at least in part on the second current signal and the reference signal. For instance, in some implementations, the one or more processors can subtract the reference signal from the second current signal to determine the difference signal. In other implementations, the one or more processors can determine the difference signal by multiplying the reference signal by a correction coefficient represented as a quotient defined by the presently applied voltage (the second applied voltage in this instance) divided by the previously applied voltage (the first applied voltage in this instance), and then subtracting the product of the reference signal and the correction coefficient from the second current signal.

At 710, the method 700 includes determining whether partial discharge is present based at least in part on the difference signal. For instance, the one or more processors can determine whether partial discharge is present by comparing the difference signal to one or more thresholds, such as a first or positive threshold and a second or negative threshold. When the difference signal exceeds a threshold, then partial discharge is determined as being present. In contrast, when the difference signal does not exceed a threshold, then partial discharge is determined as not being present.

In some implementations, the threshold is set at an expected current magnitude or within a margin (e.g., within ten percent (10%), etc.) of the expected current magnitude. The expected current magnitude can be determined by the one or more processors as an expected magnitude of the difference signal at a switching edge of a pulse of the presently applied voltage (the second applied voltage in this example), the expected magnitude being determined based at least in part on an increase in voltage between the presently applied voltage and the previously applied voltage (the first applied voltage in this example).

At 712, when it is determined that partial discharge has been detected at 710, the method 700 may cease and various properties associated with the partial discharge signal can be determined, such as pulse shape, pulse magnitude, and/or a frequency associated with the partial discharge signal.

At 714, when it is determined that partial discharge has not been detected at 710, the method 700, or rather the detection sequence, may iterate. The method may iterate at least once, but may be iterated any suitable number of times, e.g., until the partial discharge inception voltage is determined. Notably, each time the method 700 is iterated, the reference signal is updated on a rolling basis to be a previously captured current signal so that the difference signal determined at 708 for a given iteration of the method 700 is determined as a difference between a present current signal captured in response to a presently applied voltage and the previously captured current signal captured in response to a previously applied voltage. Further, each time the method 700 is iterated, the presently applied voltage is greater than the previously applied voltage. Each time the method is iterated, the presently applied voltage can be increased from the previously applied voltage between about 50 and 300 volts, for example. The presently applied voltage and the previously applied voltage can be applied via pulse width modulation, e.g., by rapid switching of the plurality of switching devices of the power electronics converter.

Stated another way, each time the method 700 is iterated, the method 700 can include capturing a present current signal in response to a presently applied voltage, the presently applied voltage being different than a previously applied voltage; setting a previous current signal as the reference signal, the previous current signal being captured in response to the previously applied voltage; determining a difference signal based at least in part on the present current signal and the reference signal; and determining whether partial discharge is present based at least in part on the difference signal.

In some implementations of method 700, once partial discharge is determined as being present at the presently applied voltage (e.g., once the partial discharge inception voltage is reached), the detection sequence can be iterated one or more times to confirm the presence of partial discharge. In this regard, the applied voltage can be stepped up or increased even further. For instance, the detection sequence can be iterated until the applied voltage is greater than or equal to the partial discharge inception voltage by a predetermined percentage, e.g., by 10%, etc.

Figure 8:
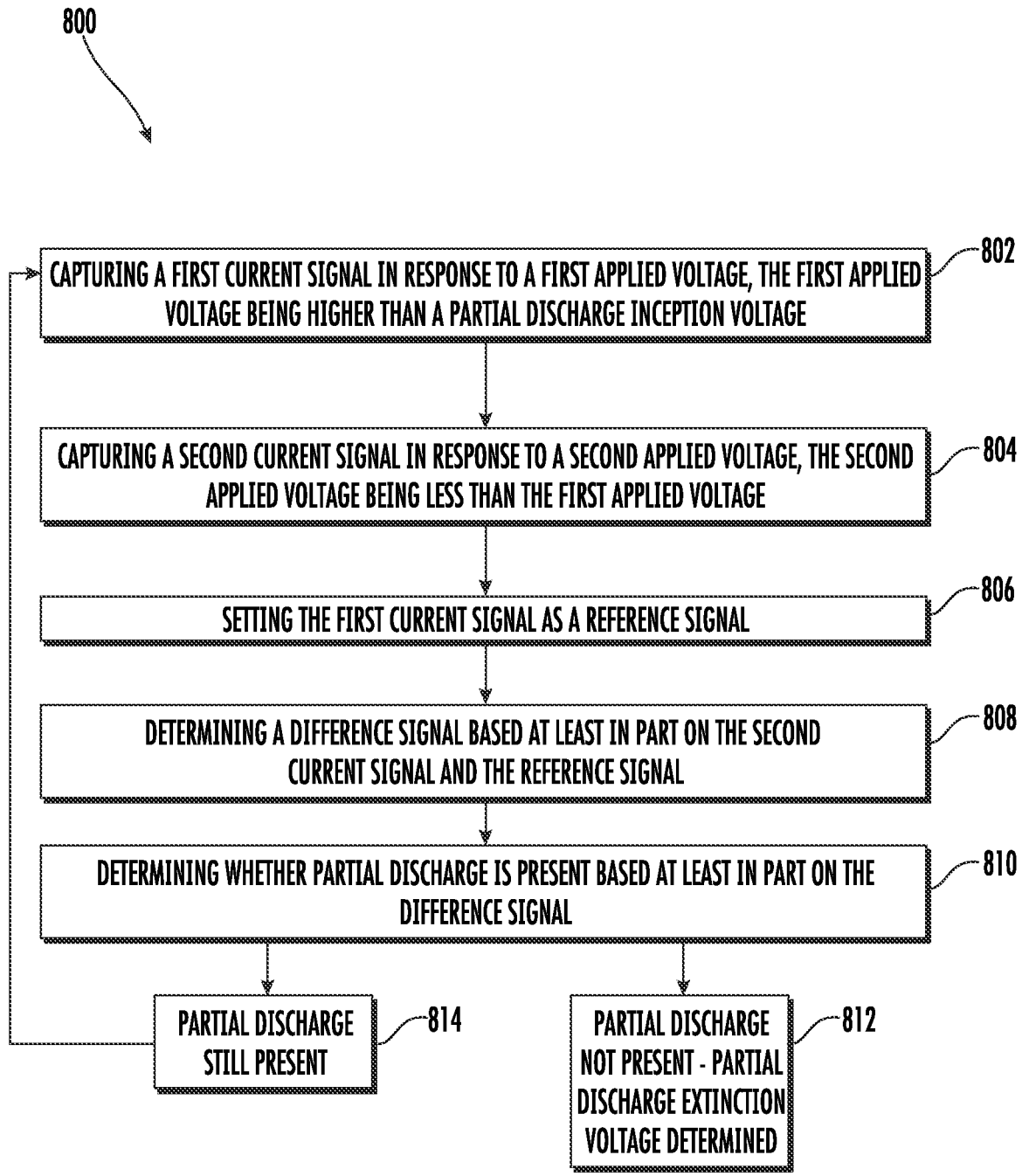
FIG. 8 provides a flow diagram for a method of detecting a partial discharge extinction voltage in accordance with an example aspect of the present disclosure.

Further, the detection sequence can be implemented to find the partial discharge extinction voltage, or the voltage at which partial discharge pulses cease to occur when the applied voltage is decreased from an applied voltage higher than the partial discharge inception voltage. In this regard, the aspects of the detection sequence set forth in FIG. 2 and the accompanying text as well as aspects of the method 700 set forth in FIG. 7 can be applied in "reverse" to detect a partial discharge extinction voltage. The detection sequence can be applied in "reverse" in that, for each iteration of the detection sequence, the voltage can be stepped down and, if the magnitude of the difference signal does not exceed a threshold, then the presently applied voltage associated with that iteration is determined as the partial discharge extinction voltage. FIG. 8 provides an example manner in which the detection sequence can be implemented to detect a partial discharge extinction voltage.

FIG. 8 provides a flow diagram for a method 800 of detecting a partial discharge extinction voltage in an electrical power system having a power electronics converter.

At 802, the method 800 includes capturing a first current signal in response to a first applied voltage, the first applied voltage being higher than a partial discharge inception voltage. For instance, a plurality of switching devices of a power electronics converter can be caused to switch, thereby causing a first applied voltage to be pulsed (i.e., as a pulse width modulated signal). Applying the first voltage can cause electrical power to be transmitted between a voltage source and a load, both of which are electrically coupled with the power electronics converter. A current transducer or other current sensor can capture the first current signal in response to the first applied voltage. The captured first current signal can be provided to one or more processors of a signal analyzer. The one or more processors can receive the captured first current signal. One or more memory devices of the signal analyzer can store the first current signal.

At 804, the method 800 includes capturing a second current signal in response to a second applied voltage, the second applied voltage being less than the first applied voltage. For instance, the plurality of switching devices of the power electronics converter can be caused to switch so as to apply a second applied voltage. The switching devices can be controlled to pulse (i.e., as a pulse width modulated signal) the second applied voltage. The second applied voltage can be stepped down by a predetermined voltage decrease or step from one iteration to the next of method 800. In some implementations, for example, the predetermined voltage decrease or step can be between 50 and 300V. The current transducer can capture the second current signal in response to the second applied voltage. The captured second current signal can be provided to the one or more processors of the signal analyzer. The one or more processors can receive the captured second current signal. One or more memory devices of the signal analyzer can store the second current signal.

At 806, the method 800 includes setting the first current signal as a reference signal. For instance, the one or more processors of the signal analyzer can set the stored first current signal as the reference signal.

At 808, the method 800 includes determining a difference signal based at least in part on the second current signal and the reference signal. For instance, in some implementations, the one or more processors can subtract the reference signal from the second current signal to determine the difference signal. In other implementations, the one or more processors can determine the difference signal by multiplying the reference signal by a correction coefficient represented as a quotient defined by the presently applied voltage (the second applied voltage in this instance) divided by the previously applied voltage (the first applied voltage in this instance), and then subtracting the product of the reference signal and the correction coefficient from the second current signal.

At 810, the method 800 includes determining whether partial discharge is present based at least in part on the difference signal. For instance, the one or more processors can determine whether partial discharge is present by comparing the difference signal to one or more thresholds, such as a first or positive threshold and a second or negative threshold. When the difference signal exceeds a threshold, then partial discharge is determined as being present. In contrast, when the difference signal does not exceed a threshold, then partial discharge is determined as not being present. When partial discharge is not detected or not present, the partial discharge extinction voltage is determined as or approximately as the presently applied voltage.

In some implementations, the threshold is set at an expected current magnitude or within a margin (e.g., within ten percent (10%)) of the expected current magnitude. The expected current magnitude can be determined by the one or more processors as an expected magnitude of the difference signal at a switching edge of a pulse of the presently applied voltage (the second applied voltage in this example), the expected magnitude being determined based at least in part on a decrease in voltage between the presently applied voltage and the previously applied voltage (the first applied voltage in this example).

At 812, when it is determined that partial discharge is no longer present at 810, the presently applied voltage is determined as the partial discharge extinction voltage and the method 800 may cease. Various properties associated with the current signal associated with the partial discharge extinction voltage can be determined, such as pulse shape, pulse magnitude, and/or a frequency of the signal.

At 814, when it is determined that partial discharge is still present at 810, the method 800, or rather the detection sequence, may iterate. The method 800 may iterate at least once, but may be iterated any suitable number of times, e.g., until the partial discharge extinction voltage is determined. Notably, each time the method 800 is iterated, the reference signal is updated on a rolling basis to be a previously captured current signal so that the difference signal determined at 808 for a given iteration of the method 800 is determined as a difference between a present current signal captured in response to a presently applied voltage and the previously captured current signal captured in response to a previously applied voltage. Further, each time the method 800 is iterated, the presently applied voltage is less or lower than the previously applied voltage. Each time the method is iterated, the presently applied voltage can be decreased from the previously applied voltage between about 50 and 300 volts, for example. The presently applied voltage and the previously applied voltage can be applied via pulse width modulation, e.g., by rapid switching of the plurality of switching devices of the power electronics converter.

Stated another way, each time the method 800 is iterated, the method 800 can include capturing a present current signal in response to a presently applied voltage, the presently applied voltage being less than a previously applied voltage; setting a previous current signal as the reference signal, the previous current signal being captured in response to the previously applied voltage; determining a difference signal based at least in part on the present current signal and the reference signal; and determining whether partial discharge is present based at least in part on the difference signal. When partial discharge is present, the method iterates with the applied voltage being stepped down. When partial discharge is not present, the presently applied voltage is determined as or approximately as the partial discharge extinction voltage. As will be appreciated by the context of method 800, the initially applied voltage in the sequence is greater than the partial discharge inception voltage.

Upon detecting the partial discharge inception voltage associated with an electrical system in accordance with the method 700 of FIG. 7 and/or detecting the partial discharge extinction voltage in accordance with the method 800 of FIG. 8, one or more control actions can be taken in response thereto.

In some implementations, for example, upon detecting a partial discharge inception voltage and/or to detecting a partial discharge extinction voltage, one or more components of the system can be controlled in response to such a detection. For instance, the power converter or load (e.g., an electric machine) of the system can be controlled in response to detection of partial discharge. The power converter and/or load can be controlled to avoid or otherwise reduce the instances in which they operate at the conditions/settings that gave rise to the detected partial discharge. Such active control may be particularly useful for systems implemented in the field.

In other implementations, upon detecting a partial discharge inception voltage and/or to detecting a partial discharge extinction voltage, one or more notifications can be generated and communicated to one or more entities, such as the operator of the system, maintenance personnel, the manufacturer of the system, etc. In some implementations, the notification can indicate detection of partial discharge, and in some instances, the properties of the partial discharge, such as the pulse shape, pulse magnitude, and/or frequency associated with the partial discharge signal, among other possibilities.

In other implementations, one or more service or maintenance tasks can be scheduled in response to detecting a partial discharge inception voltage and/or to detecting a partial discharge extinction voltage. For instance, one or more service or maintenance tasks can be scheduled to visually check the insulation systems of one or more components of the system, repair or replace the insulation systems of one or more components of the system, repair or replace one or more components of the system, etc. Further, in response to detecting a partial discharge inception voltage and/or to detecting a partial discharge extinction voltage, data capturing the partial discharge detection and conditions surrounding the detection can be routed to a monitoring system, such as a prognostics and health monitoring system. Such a monitoring system can use the data to track component health and make suggestions and predictions as to servicing of one or more components of the system. Such monitoring systems may prevent failures and unplanned outages.

Figure 9:
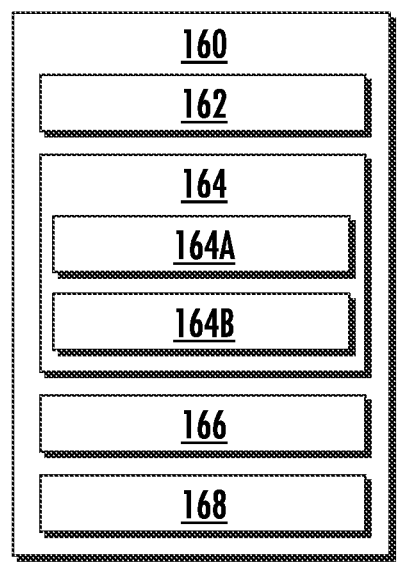
FIG. 9 provides a detailed system diagram of a signal analyzer of the detection system of FIG. 1.

FIG. 9 provides a detailed system diagram of the signal analyzer 160 according to example embodiments of the present disclosure. As noted, the signal analyzer 160 can include one or more processor(s) 162 and one or more memory device(s) 164. The one or more processor(s) 162 can include any suitable processing device, such as a microprocessor, microcontroller, integrated circuit, logic device, and/or other suitable processing device. The one or more memory device(s) 164 can include one or more computer-executable or computer readable medium, including, but not limited to, non-transitory computer-readable medium, RAM, ROM, hard drives, flash drives, and/or other memory devices.

The one or more memory device(s) 164 can store information accessible by the one or more processor(s) 162, including computer-readable or computer-executable instructions 164A that can be executed by the one or more processor(s) 162. The instructions 164A can be any set of instructions that when executed by the one or more processor(s) 162, cause the one or more processor(s) 162 to perform operations. In some embodiments, the instructions 164A can be executed by the one or more processor(s) 162 to cause the one or more processor(s) 162 to perform operations, such as any of the operations and functions for which the signal analyzer 160 is configured. The instructions 164A can be software written in any suitable programming language or can be implemented in hardware. Additionally, and/or alternatively, the instructions 164A can be executed in logically and/or virtually separate threads on processor(s) 162. The memory device(s) 164 can further store data 164B that can be accessed by the processor(s) 162. For example, the data 164B can include models, lookup tables, databases, etc.

The signal analyzer includes one or more displays 166. The one or more displays 166 can render various images, such as images captured by the current transducer 150 (FIG. 1). The signal analyzer 160 can also include a network interface 168 used to communicate, for example, with the other components of the detection system 140 and/or the system 100 (FIG. 1), e.g., via a communication network. The network interface 168 can include any suitable components for interfacing with one or more network(s), including for example, transmitters, receivers, ports, controllers, antennas, and/or other suitable components.

Figure 10:
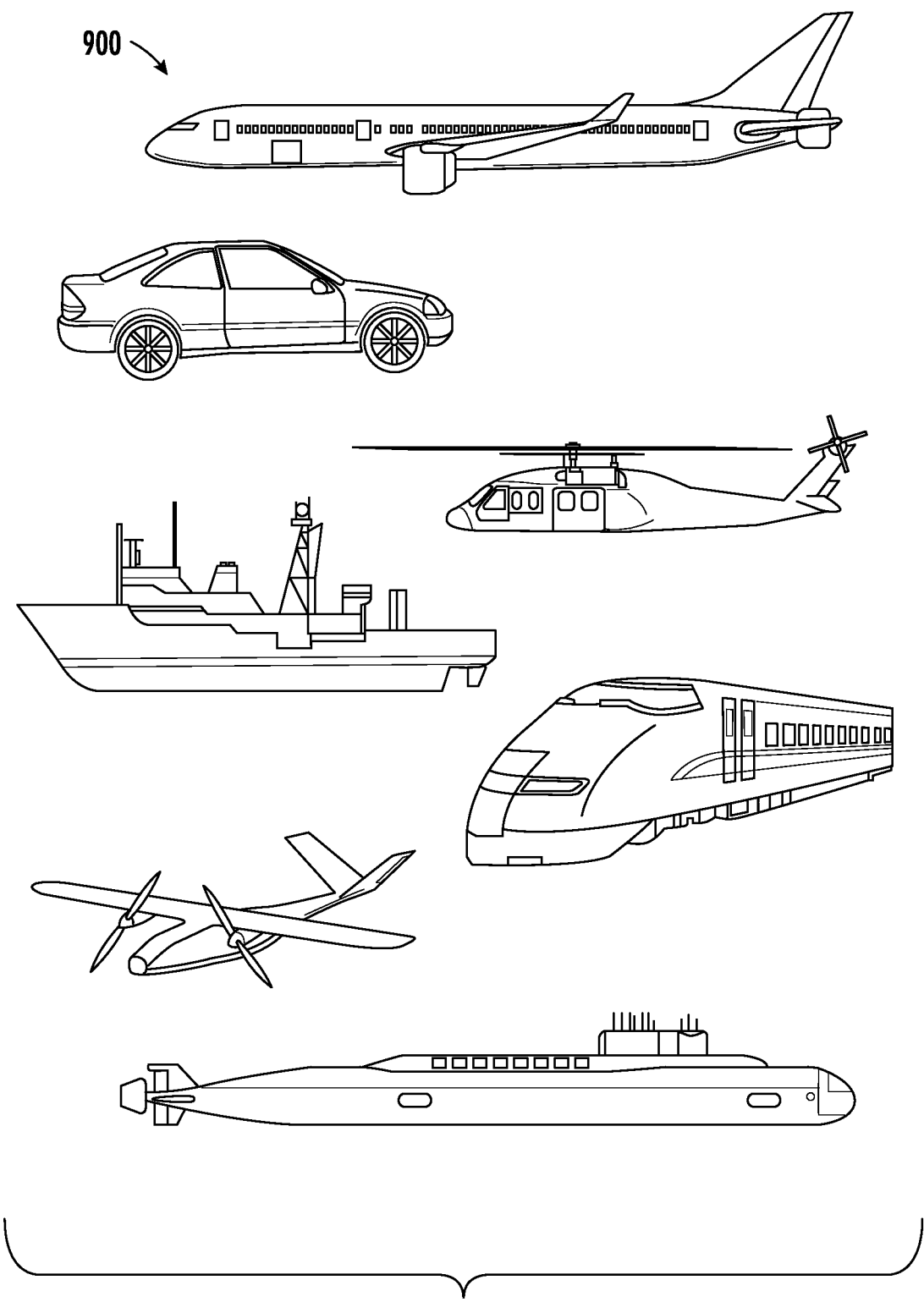
FIG. 10 provides example vehicles according to example embodiments of the present subject matter.

FIG. 10 provides example vehicles 900 according to example embodiments of the present subject matter. The system 100 and/or detection system 140 disclosed herein can be implemented on any suitable vehicle, including, without limitation, an aircraft, such as a fixed-wing airplane, helicopter, or unmanned aerial vehicle or drone. In this regard, the system 100 can be an electrical power system for an aircraft. The detection system 140 can be located onboard for active component monitoring or can be located offboard, e.g., in a lab for component testing or in a service/maintenance shop for off-wing or on-wing inspection. Further, the system 100 and/or detection system 140 disclosed herein can be implemented on automobiles, boats, ships, submarines, trains, hovercraft (not pictured), tanks (not pictured), as well as other types of vehicles. Further, the inventive aspects of the present disclosure can be implemented on or for non-vehicle applications, such as land-based power generation applications, testing laboratories, as well as other applications.

The disclosed detection techniques can provide certain advantages, benefits, and/or technical effects. For instance, the disclosed detection techniques can allow for detection of electrical discharge activity without loss of signal across a wide frequency bandwidth. Further, partial discharge signals hidden in noise, such as transient current responses or current clusters, can be more easily detected. Moreover, in addition to determining whether partial discharge is present, various properties about a detected partial discharge signal can be determined, such as pulse shape, pulse magnitude, and/or a frequency associated with the partial discharge signal. The disclosed techniques may allow for detection of the partial discharge inception voltage as well as the partial discharge extinction voltage.

The technology discussed herein makes reference to computer-based systems and actions taken by and information sent to and from computer-based systems. One of ordinary skill in the art will recognize that the inherent flexibility of computer-based systems allows for a great variety of possible configurations, combinations, and divisions of tasks and functionality between and among components. For instance, processes discussed herein can be implemented using a single computing device or multiple computing devices working in combination. Databases, memory, instructions, and applications can be implemented on a single system or distributed across multiple systems. Distributed components can operate sequentially or in parallel.

Although specific features of various embodiments may be shown in some drawings and not in others, this is for convenience only. In accordance with the principles of the present disclosure, any feature of a drawing may be referenced and/or claimed in combination with any feature of any other drawing.

This written description uses examples to disclose the present disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

Further aspects are provided by the subject matter of the following clauses:

1. A method of detecting partial discharge in an electrical power system having a power electronics converter, the method comprising: capturing a first current signal in response to a first applied voltage; capturing a second current signal in response to a second applied voltage, the second applied voltage being different than the first applied voltage; setting the first current signal as a reference signal; determining a difference signal based at least in part on the second current signal and the reference signal; and determining whether partial discharge is present based at least in part on the difference signal.

2. The method of any preceding clause, wherein the method is iterated at least once, and wherein each time the method is iterated, the reference signal is updated on a rolling basis to be a previously captured current signal so that the difference signal for a given iteration of the method is determined as a difference between a present current signal captured in response to a presently applied voltage and the previously captured current signal captured in response to a previously applied voltage.

3. The method of any preceding clause, wherein each time the method is iterated, the presently applied voltage is greater than the previously applied voltage.

4. The method of any preceding clause, wherein the first applied voltage is greater than a partial discharge inception voltage, and wherein each time the method is iterated, the presently applied voltage is decreased from the previously applied voltage.

5. The method of any preceding clause, wherein the difference signal is determined by subtracting the reference signal from the second current signal to determine a difference, the difference being the difference signal.

6. The method of any preceding clause, wherein the difference signal is determined by: multiplying the reference signal by a correction coefficient represented as a quotient defined by the second applied voltage divided by the first applied voltage; and subtracting a product of the reference signal and the correction coefficient from the second current signal.

7. The method of any preceding clause, wherein when the difference signal exceeds a threshold, then partial discharge is determined as being present, and wherein when the difference signal does not exceed the threshold, then partial discharge is determined as not being present.

8. The method of any preceding clause, wherein the threshold is set at an expected current magnitude or within a margin of the expected current magnitude, the expected current magnitude being determined as an expected magnitude of the difference signal at a switching edge of a pulse of the second applied voltage, the expected magnitude being determined based at least in part on an increase in voltage between the second applied voltage and the first applied voltage.

9. The method of any preceding clause, wherein the method is iterated at least once, and wherein each time the method is iterated, the method comprises: capturing a present current signal in response to a presently applied voltage, the presently applied voltage being different than a previously applied voltage; setting a previous current signal as the reference signal, the previous current signal being captured in response to the previously applied voltage; determining a difference signal based at least in part on the present current signal and the reference signal; and determining whether partial discharge is present based at least in part on the difference signal.

10. The method of any preceding clause, wherein each time the method is iterated, the presently applied voltage is greater than the previously applied voltage by a predetermined voltage increase, the predetermined voltage increase being fixed from iteration to iteration.

10a. The method of any preceding clause, further comprising: performing a control action in response to detecting partial discharge in the electrical power system.

11. A system, comprising: a voltage source; a power converter electrically coupled with the voltage source, the power converter having a plurality of switching devices; a load electrically coupled with the power converter; and a detection system having a current transducer and a signal analyzer, the signal analyzer having one or more processors configured to implement a detection sequence, wherein in implementing the detection sequence, the one or more processors are configured to: receive a first current signal captured in response to a first voltage applied by switching of the plurality of switching devices; receive a second current signal captured in response to a second voltage applied by switching of the plurality of switching devices, the second voltage being different than the first voltage; set the first current signal as a reference signal; determine a difference signal based at least in part on the second current signal and the reference signal; and determine whether partial discharge is present based at least in part on the difference signal.

12. The system of any preceding clause, wherein the detection sequence is iterated at least once, and wherein each time the detection sequence is iterated, the reference signal is updated on a rolling basis to be a previously captured current signal so that the difference signal for a given iteration of the detection sequence is determined as a difference between a present current signal captured in response to a presently applied voltage and the previously captured current signal captured in response to a previously applied voltage.

13. The system of any preceding clause, wherein each time the detection sequence is iterated, the presently applied voltage is greater than the previously applied voltage.

14. The system of any preceding clause, wherein the first voltage applied is greater than a partial discharge inception voltage, and wherein each time the detection sequence is iterated, the presently applied voltage is decreased from the previously applied voltage.

15. The system of any preceding clause, wherein when the difference signal exceeds a threshold, then partial discharge is determined as being present, and wherein when the difference signal does not exceed the threshold, then partial discharge is determined as not being present.

16. The system of any preceding clause, wherein the threshold is set at an expected current magnitude or within a margin of the expected current magnitude, the expected current magnitude being determined as an expected magnitude of the difference signal at a switching edge of a pulse of the second voltage, the expected magnitude being determined based at least in part on an increase in voltage between the second voltage and the first voltage.

17. A non-transitory computer readable medium comprising computer-executable instructions, which, when executed by one or more processors, cause the one or more processors to implement a detection sequence, wherein in implementing the detection sequence, the one or more processors are configured to: receive a first current signal captured in response to a first applied voltage; receive a second current signal captured in response to a second applied voltage, the second applied voltage being different than the first applied voltage; set the first current signal as a reference signal; determine a difference signal based at least in part on the second current signal and the reference signal; and determine whether partial discharge is present based at least in part on the difference signal.

18. The non-transitory computer readable medium of any preceding clause, wherein the detection sequence is iterated at least once, and wherein each time the detection sequence is iterated, the reference signal is updated on a rolling basis to be a previously captured current signal so that the difference signal for a given iteration of the detection sequence is determined as a difference between a present current signal captured in response to a presently applied voltage and the previously captured current signal captured in response to a previously applied voltage.

19. The non-transitory computer readable medium of any preceding clause, wherein each time the detection sequence is iterated, the presently applied voltage is greater than the previously applied voltage.

20. The non-transitory computer readable medium of any preceding clause, wherein when the difference signal exceeds a threshold, then partial discharge is determined as being present, and wherein when the difference signal does not exceed the threshold, then partial discharge is determined as not being present.

We claim:

1. A method of detecting partial discharge in an electrical power system having a power electronics converter, the method comprising:
applying a first voltage to the electrical power system;
capturing a first current signal in response to the first applied voltage;
applying a second voltage to the electrical power system, the second applied voltage being different than the first applied voltage;
capturing a second current signal in response to the second applied voltage;
setting the first current signal as a reference signal;
determining a difference signal based at least in part on the second current signal and the reference signal, wherein the difference signal is determined by multiplying the reference signal by a correction coefficient represented as a quotient defined by the second applied voltage divided by the first applied voltage and subtracting a product of the reference signal and the correction coefficient from the second current signal; and determining whether partial discharge is present based at least in part on the difference signal.

2. The method of claim 1, wherein the method is iterated at least once, and wherein each time the method is iterated, the reference signal is updated on a rolling basis to be a previously captured current signal so that the difference signal for a given iteration of the method is determined as a difference between a present current signal captured in response to a presently applied voltage and the previously captured current signal captured in response to a previously applied voltage.

3. The method of claim 2, wherein each time the method is iterated, the presently applied voltage is greater than the previously applied voltage.

4. The method of claim 2, wherein the first applied voltage is greater than a partial discharge inception voltage, and wherein each time the method is iterated, the presently applied voltage is decreased from the previously applied voltage.

5. The method of claim 1, wherein the difference signal is determined by subtracting the reference signal from the second current signal to determine a difference, the difference being the difference signal.

6. The method of claim 1, wherein when the difference signal exceeds a threshold, then partial discharge is determined as being present, and wherein when the difference signal does not exceed the threshold, then partial discharge is determined as not being present.

7. The method of claim 6, wherein the threshold is set at an expected current magnitude or within a margin of the expected current magnitude, the expected current magnitude being determined as an expected magnitude of the difference signal at a switching edge of a pulse of the second applied voltage, the expected magnitude being determined based at least in part on an increase in voltage between the second applied voltage and the first applied voltage.

8. The method of claim 1, wherein the method is iterated at least once, and wherein each time the method is iterated, the method comprises:
capturing a present current signal in response to a presently applied voltage, the presently applied voltage being different than a previously applied voltage;
setting a previous current signal as the reference signal, the previous current signal being captured in response to the previously applied voltage;
determining a difference signal based at least in part on the present current signal and the reference signal; and
determining whether partial discharge is present based at least in part on the difference signal.

9. The method of claim 8, wherein each time the method is iterated, the presently applied voltage is greater than the previously applied voltage by a predetermined voltage increase, the predetermined voltage increase being fixed from iteration to iteration.

10. A system, comprising:
a voltage source;
a power converter electrically coupled with the voltage source, the power converter having a plurality of switching devices;
a load electrically coupled with the power converter; and
a detection system having a current transducer and a signal analyzer, the signal analyzer having one or more processors configured to implement a detection sequence, wherein in implementing the detection sequence, the one or more processors are configured to:
apply a first voltage by switching of the plurality of switching devices;
receive a first current signal captured in response to the first voltage;
apply a second voltage by switching of the plurality of switching devices, the second voltage being different than the first voltage;
receive a second current signal captured in response to the second voltage;
set the first current signal as a reference signal;
determine a difference signal based at least in part on the second current signal and the reference signal; and
determine whether partial discharge is present based at least in part on the difference signal;
wherein when the difference signal exceeds a threshold, then partial discharge is determined as being present, and wherein when the difference signal does not exceed the threshold, then partial discharge is determined as not being present; and
wherein the threshold is set at an expected current magnitude or within a margin of the expected current magnitude, the expected current magnitude being determined as an expected magnitude of the difference signal at a switching edge of a pulse of the second voltage, the expected magnitude being determined based at least in part on an increase in voltage between the second voltage and the first voltage.

11. The system of claim 10, wherein the detection sequence is iterated at least once, and wherein each time the detection sequence is iterated, the reference signal is updated on a rolling basis to be a previously captured current signal so that the difference signal for a given iteration of the detection sequence is determined as a difference between a present current signal captured in response to a presently applied voltage and the previously captured current signal captured in response to a previously applied voltage.

12. The system of claim 11, wherein each time the detection sequence is iterated, the presently applied voltage is greater than the previously applied voltage.

13. The system of claim 11, wherein the first voltage applied is greater than a partial discharge inception voltage, and wherein each time the detection sequence is iterated, the presently applied voltage is decreased from the previously applied voltage.

14. A non-transitory computer readable medium comprising computer-executable instructions, which, when executed by one or more processors, cause the one or more processors to implement a detection sequence, wherein in implementing the detection sequence, the one or more processors are configured to:
apply a first voltage;
receive a first current signal captured in response to the first applied voltage;
apply a second voltage, the second applied voltage being different than the first applied voltage;
receive a second current signal captured in response to the second applied voltage;
set the first current signal as a reference signal;
determine a difference signal based at least in part on the second current signal and the reference signal, wherein the difference signal is determined by multiplying the reference signal by a correction coefficient represented as a quotient defined by the second applied voltage divided by the first applied voltage and subtracting a product of the reference signal and the correction coefficient from the second current signal; and determine whether partial discharge is present based at least in part on the difference signal.

15. The non-transitory computer readable medium of claim 14, wherein the detection sequence is iterated at least once, and wherein each time the detection sequence is iterated, the reference signal is updated on a rolling basis to be a previously captured current signal so that the difference signal for a given iteration of the detection sequence is determined as a difference between a present current signal captured in response to a presently applied voltage and the previously captured current signal captured in response to a previously applied voltage.

16. The non-transitory computer readable medium of claim 15, wherein each time the detection sequence is iterated, the presently applied voltage is greater than the previously applied voltage.

17. The non-transitory computer readable medium of claim 14, wherein when the difference signal exceeds a threshold, then partial discharge is determined as being present, and wherein when the difference signal does not exceed the threshold, then partial discharge is determined as not being present.

* * * * *